Sept. 18, 1962 A. S. ROSE ETAL 3,054,174

METHOD FOR MAKING SEMICONDUCTOR DEVICES

Filed May 13, 1958

INVENTORS
ARNOLD S. ROSE &
HOWARD W. BERTRAM
BY J. L. Whittaker
ATTORNEY

United States Patent Office 3,054,174

Patented Sept. 18, 1962

3,054,174

METHOD FOR MAKING SEMICONDUCTOR DEVICES

Arnold S. Rose, Plainfield, and Howard W. Bertram, Somerville, N.J., assignors to Radio Corporation of America, a corporation of Delaware Filed May 13, 1958, Ser. No. 734,887
13 Claims. (Cl. 29—470)

This invention relates to semiconductor devices, and more particularly to an improved method for making such devices of the type known as surface alloyed junction devices.

Broad-area junction devices such as transistors may be fabricated by the fusion or surface alloy process, in which electrode pellets of conductivity type-determining impurity material are alloyed into opposite sides of a monocrystalline semiconductor wafer. Alloying is usually accomplished by positioning the pellet in contact with the surface of the wafer, and heating the pellet-wafer assembly to a temperature above the melting point of the electrode pellet but below the melting point of the semiconductor wafer. The wafer may be germanium or silicon or the like, but must be of conductivity type opposite to the pellet material, so that the alloy front between the pellet and the wafer becomes the site of a rectifying PN junction. The process is described in "A Developmental Germanium PNP Junction Transistor," by Law, Mueller, Pankove and Armstrong, Proceedings of the IRE, Volume 40, November 1952.

Some difficulties have been experienced in the mass production of transistors by this method, particularly in the attachment of connector wires to the electrode pellets. This operation is usually performed by a skilled worker handling each unit separately. The operator has to pick up each unit, pick up a connector wire, dip the wire in a flux, position the connector wire so that one end contacts the electrode of the unit, and then carefully hold the assembly in a hot hydrogen jet for about half a minute so as to solder the wire to the electrode without injuring the semiconductor wafer. For devices such as transistors having a plurality of such electrodes, the entire process must be repeated for each electrode. The soldering step thus requires considerable individual handling of each unit, and causes much scrap in production. Such extensive hand operations are time consuming and are not amenable to the requirements of mass production.

Accordingly, it is an object of the present invention to provide an improved and novel method of making a semiconductor device.

Another object is to provide a novel and improved method for making alloy junction transistors.

Still another object is to provide a novel and improved method for attaching electrical leads to the electrodes of an alloy junction semiconductor device.

Yet another object is to provide a novel and improved method amenable to mass production techniques for making alloy junction transistors having electrical leads attached to the electrodes thereof.

These and other objects may be accomplished according to the instant invention which comprises a novel and improved method for forming a semiconductor device of the alloy junction type. Broadly, the invention provides an improved method of attaching a connector wire to a semiconductor device which includes a soft metallic electrode having a melting point lower than that of the semiconductor. The method comprises the step of inserting one end of the wire into the electrode and then bonding the wire to the electrode by heating the assembly of device and wire in a bath maintained at a temperature above the melting point of the electrode, so that the electrode melts and flows around the connector wire. The assembly is then removed from the bath and the electrode is permitted to solidify, thereby forming a strong bond to the connector wire. The bath preferably consists of an organic compound which has a relatively high boiling point, or a boiling point higher than the melting point of the electrode, and is inert with respect to the device.

The invention will be described in greater detail with reference to the drawing, of which:

Similar reference characters have been applied to similar elements throughout the drawing.

Figure 1:
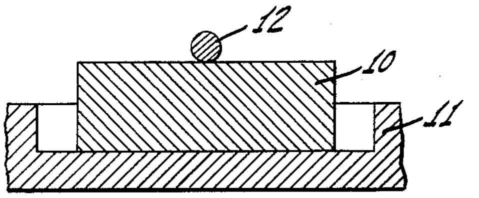
FIGURES 1–4 are schematic cross-sectional views of successive steps in the fabrication of a semiconductor device in accordance with the invention.

An alloy junction semiconductor device of the diode type may be fabricated by alloying an electrode pellet, which may, for example, be indium, to a wafer of germanium or silicon or the like. FIGURE 1 shows a wafer 10 of N-type monocrystalline semiconductive germanium soldered to a conductive metal base plate 11, which may, for example, be nickel. The exact size and shape of the wafer is not critical. In this example, the wafer 10 is about 200 mils square and 8 mils thick, and contains sufficient donor impurities to have a resistivity of about 2 to 20 ohm-centimeters. An indium electrode pellet 12 is positioned at the center of the upper major surface of the wafer 10, and is then alloyed to the wafer. The pellet 12 may be a disc or spherule having a radius of about 15 mils. Alloying is accomplished by heating the pellet-wafer assembly for about 10 minutes at about 550° C. in a non-oxidizing ambient such as argon.

Figure 2:
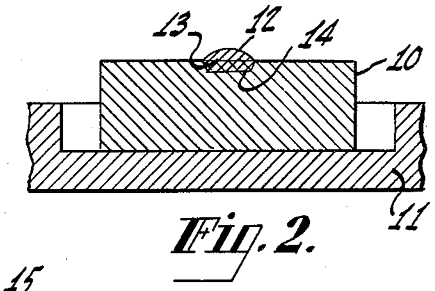

During the alloying step the electrode pellet 12 melts and assumes the characteristic hap-shaped profile shown in FIGURE 2. The molten pellet 12 dissolves some of the material of the wafer 10. When the assembly is cooled, the dissolved wafer material recrystallizes in a zone 13 which is continuous with the original crystal lattice of the wafer. The recrystallized zone 13 contains sufficient indium to be of P-conductivity type. A PN rectifying barrier 14 is formed at the interface between the recrystallized P-type zone 13 and the N-type bulk of the wafer 10.

Figure 3:
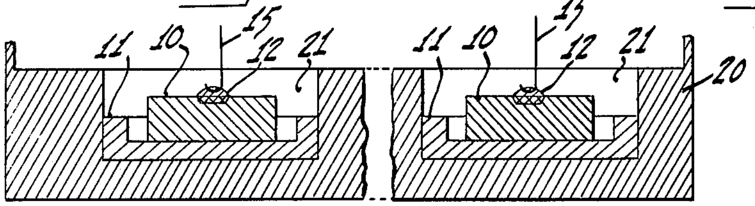
Figure 5:
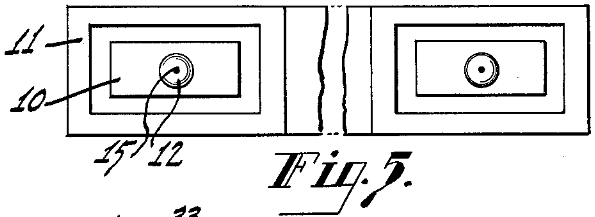
FIGURE 5 is a plan view of the step shown in FIGURE 3.

The units are then loaded into a rack or support. The exact size, shape and material of the rack is not critical, although an inert material such as stainless steel is preferred. The rack may for example be a bar with a plurality of holes in one surface adapted to hold the units. A suitable rack found in most semiconductor factories is the etch bar 20 shown in FIGURES 3 and 5. Each etch bar holds a plurality of units. In this example, the etch bar 20 is adapted to hold ten units. Connector wires 15, which may for example be nickel, copper, tungsten, molybdenum, fernico or the like, are then inserted into each electrode pellet 11. Electrode pellet materials such as indium and indium alloys and the like are sufficiently soft at room temperatures to permit the penetration of connector wires under moderate pressure. However, wires thus inserted are not firmly bonded to the electrode, and will easily pull out of the electrode pellet. Although straight wires may be utilized if desired, it is advantageous to use connector wires 15 which are shaped like the letter J, as shown in FIGURE 3, in order to prevent possible scratching of the wafer by the wire and to provide additional area for that portion of the connector wire 15 which is subsequently bonded to the electrode pellet 11.

Figure 4:
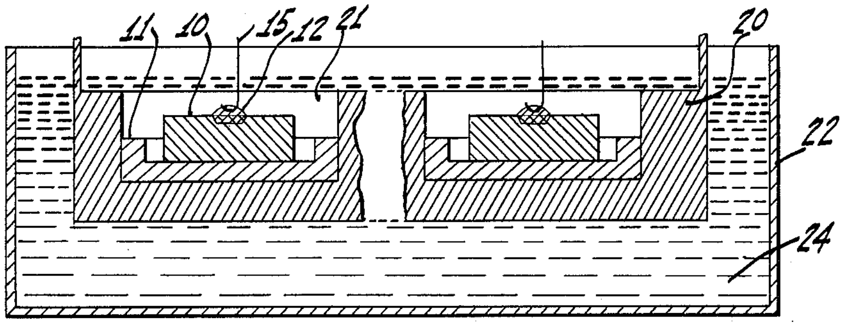

The etch bar 20 containing the ten units is then immersed in the bath 22 as shown in FIGURE 4. The bath 22 contains an organic compound 24 which is liquid at the temperature of the bath and is inert with respect to the materials comprising the device, including the connector wires 15, the electrode pellets 12, and the semiconductor wafers 10. The compound 24 has a relatively high boiling point which is preferably above the melting point of the pellet 11. Suitable compounds for this purpose have a boiling point above 190° C., and include molten anhydrous lanolin, silicones, high boiling point alcohols such as glycerin and polyethylene glycols such as ethylene glycol. The bath is maintained at a temperature preferably not more than 50° C. above the melting point of the electrode. In this example, the compound 24 consists of glycerin, and is maintained at a temperature between 180° C. and 190° C. The etch bar 20 and the ten units with the connector wires inserted in the electrodes are kept in the bath for about 5 to 10 seconds. The indium electrodes are melted by the hot glycerin during this operation, but are not moved from their original positions on each wafer. The etch bar 20 and the plurality of units contained therein are then removed and allowed to cool to room temperature. During the cooling step, which usually requires a few minutes, the molten electrode 12 of each unit freezes around the connector wire 15 and forms a strong uniform connection thereto. Thus ten connector wires are bonded to ten units in a single operation by an unskilled operator in less time than required by a skilled operator for a single unit using the prior art method. Furthermore, the process of this invention results in practically no scrap.

The etch bar 20 and the units are next immersed in a static cold water bath, and finally sprayed with deionized water to remove the glycerin. The units are then ready for the conventional operations required to complete each device, including etching, mounting and encapsulating.

It will be understood that the above illustration in terms of a single junction unit, such as a diode, is by way of example only. The invention is equally applicable to the fabrication of multi-electrode devices such as transistors. In the manufacture of surface alloyed transistors, an emitter pellet is alloyed to one major face of the wafer, and a collector electrode pellet is alloyed to the opposite major face coaxially opposite the emitter electrode. The units are then loaded in an etch bar, and connector wires are inserted in each pellet. The assembly is then treated as described above, thereby bonding the connector wires to both the emitter and collector electrode pellets. Although ethylene glycol and glycerin have been mentioned, other polyethylene glycols and high boiling point alcohols may be utilized instead.

If desired, the units may be dipped in a soldering flux after they have been loaded into the etch bar and before they have been immersed in the hot bonding bath. The action of the flux aids in bonding the connector wires to the electrodes. Suitable fluxes are zinc chloride, zinc chloride plus ammonium chloride, and dilute hydrochloric acid. The same effect may be obtained without the necessity of a separate flux dipping operation by the incorporation of a flux in the bath liquid. For example, instead of pure glycerin as described above, the bath may contain a solution of about 2% to 10% zinc chloride in glycerin, or about 2% to 10% of a mixture of zinc chloride and ammonium chloride in ethylene glycol.

It will of course be understood that the dimensions of the parts as described above are illustrative only and not a limitation. The etch bar 20 may for example be made of nickel, stainless steel, graphite or the like, and may be of any convenient configuration to hold a plurality of units. The practice of the invention is equally advantageous in the production of other sizes and types of semiconductor devices. Other materials may be utilized and modifications of the process may be made without departing from the spirit and scope of the invention.

Figure 6:
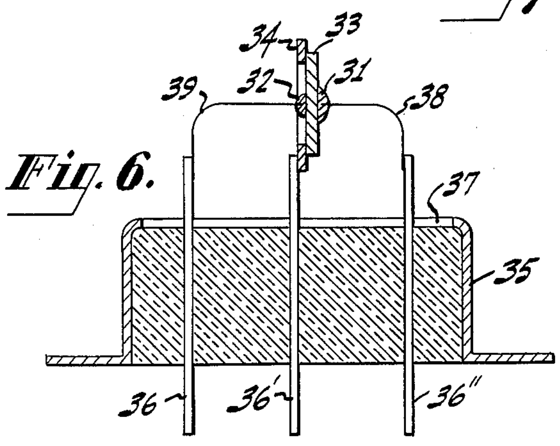
FIGURE 6 is a schematic cross-sectional view of an alloy junction transistor assembly ready for processing in accordance with the invention.

The method of the invention will now be described in connection with the fabrication of surface alloyed transistors, as illustrated in FIGURE 6. Indium electrodes 31 and 32 are alloyed to coaxially opposite portions of two major faces of a mono-crystalline N-type germanium wafer 33 which has been soldered to a nickel base tab 34. A metal stem 35 is previously prepared to hold three pins 36, 36′, and 36″ separated by an insulator 37 such as glass. One end of nickel connector wires 38 and 39 is welded to one end of pins 36 and 36″ respectively. The assembly of base tab, wafer, and alloyed electrodes is then mounted on stem 35 by welding tab 34 to pin 36′. The other end of connector wires 38 and 39 is bent by the operator and pressed into electrodes 31 and 32 respectively. A plurality of the stem-mounted units is then loaded into a rack such as the etch bar 20 in FIGURE 3. The bar and the assembled units mounted thereon are dipped into a flux bath containing about 8% hydrochloric acid by volume dissolved in a polyethylene glycol. A suitable material for the flux bath is Carbowax 400. The etch bar and the fluxed units are then immersed for about 5 to 10 seconds in a bonding bath maintained at about 185° C. The bonding bath consists of an inert organic liquid having a boiling point above 190° C. A suitable material for this purpose is a polyethylene glycol such as Carbowax 600. Since indium melts at about 155° C. the emitter and collector electrodes 31 and 32 soften and melt in the bath so as to flow around the connector wires 38 and 39, but the electrodes still adhere to the germanium wafer 33. When the units are removed and cooled, the electrodes 31 and 32 freeze around the connector wires 38 and 39 and form a firm bond thereto. In this manner an operator can rapidly handle a plurality of transistors in a single operation. The units are then completed by conventional etching and casing techniques known to the art.

There has thus been described a novel method for making improved semiconductor devices of the alloy junction type. The method is particularly suitable for the mass production of alloyed junction transistors having electrical leads firmly attached to the electrodes thereof.

What is claimed is:

1. The method of attaching a connector wire to a semiconductor device which includes a body of semiconductor material having a particular melting point and a soft metallic alloyed electrode having a melting point lower than that of said semiconductor, comprising the step of inserting said wire into said electrode, heating the assembly of said device and said wire in a bath maintained at a temperature above the melting point of said electrode, so that said electrode melts and flows around said wire, said bath consisting of an organic compound which has a boiling point above the melting point of said electrode and is inert with respect to said device, removing said assembly from said bath, and permitting said electrode to solidify.

2. The method of attaching a connector wire to a semiconductor device which includes a body of semiconductor material having a particular melting point and a soft metallic alloyed electrode having a melting point lower than that of said semiconductor, comprising the step of inserting said wire into said electrode, heating the assembly of said device and said wire in a bath maintained at a temperature above the melting point of said electrode, so that said electrode melts and flows around said wire, said bath consisting of an organic compounds which has a boiling point above 190° C. and is inert with respect to said device, removing said assembly from said bath, and permitting said electrode to solidify.

3. The method of attaching a connector wire to a semiconductor device which includes a body of semiconductor material having a particular melting point and a soft metallic alloyed electrode having a melting point lower than that of said semiconductor, comprising the step of inserting said wire into said electrode, heating the assembly of said device and said wire in a bath maintained at a temperature above the melting point of said electrode, so that said electrode melts and flows around said wire, said bath consisting of an organic compound which has a relatively high boiling point and is inert with respect to said device, removing said assembly from said bath, and permitting said electrode to solidify.

4. The method of attaching a connector wire to a semiconductor device containing a soft metallic electrode alloyed to a semiconductor body, the melting point of said electrode being lower than the melting point of said body, comprising the step of inserting said wire into said electrode, heating the assembly of said device and said wire in a bath maintained at a temperature above the melting point of said electrode so that said electrode melts and flows around said wire, removing said assembly from said bath, and permitting said electrode to solidify around said wire, said bath consisting of an organic compound selected from the group consisting of silicones, molten anhydrous lanolin, polyethylene glycols, and other alcohols with a boiling point about 190° C.

5. The method of attaching a connector wire to a semiconductor device containing a soft metallic electrode alloyed to a semiconductor body, the melting point of said electrode being lower than the melting point of said body, comprising the step of inserting said wire into said electrode, heating the assembly of said device and said wire in a glycerin bath maintained at a temperature not more than 50° C. above the melting point of said electrode, so that said electrode melts and flows around said wire, removing said assembly from said bath, and permitting said electrode to solidify around said wire.

6. The method of attaching a connector wire to a semiconductor device which includes a semiconductor body and an indium electrode alloyed to the surface of said body, the melting point of said electrode being lower than the melting point of said body, comprising the step of inserting said wire in said electrode, heating the assembly of said device and said wire by immersion in a bath maintained at about 185° C. so that said electrode melts and flows around said wire, removing said assembly from said bath, and permitting said electrode to solidify around said wire, said bath consisting of an organic compound which has a boiling point above 190° C. and is inert with respect to said device.

7. The method of attaching a connector wire to a semiconductor device containing an indium electrode alloyed to a germanium wafer, comprising the step of inserting said wire in said electrode, heating the assembly of said device and said wire by immersion in a bath maintained at about 185° C. so that said electrode melts and flows around said wire, removing said assembly from said bath, and permitting said electrode to solidify around said wire, said bath consisting of a polyethylene glycol having a boiling point above 190° C.

8. The method of attaching a connector wire to a semiconductor device containing an indium electrode pellet alloyed to a germanium wafer, comprising the step of inserting said wire into said pellet, dipping the assembly of said wire and said device into a soldering flux, heating said assembly by immersion for about 5 to 10 seconds in a bath maintained at about 185° C. so that said electrode melts and flows around said wire, removing said assembly from said bath, and permitting said electrode to solidify around said wire, said bath consisting of an alcohol having a boiling point above 190° C.

9. The method of attaching a connector wire to a semiconductor device containing an indium electrode alloyed to a germanium wafer, comprising the step of inserting said wire in said electrode, heating the assembly of said device and said wire for about 5 to 10 seconds by immersion in a bath maintained at about 185° C. so that said electrode melts and flows around said wire, removing said assembly from said bath, and permitting said electrode to solidify around said wire, said bath consisting essentially of an alcohol having a boiling point above 190° C. and containing a quantity of soldering flux.

10. The method of soldering a lead wire to a semiconductor device containing an indium electrode alloyed to a germanium wafer, comprising the step of inserting said wire in said electrode, heating the assembly of said device and said wire for about 5 to 10 seconds by immersion in a bath maintained at about 185° C. so that said electrode melts and flows around said wire, removing said assembly from said bath, and permitting said electrode to solidify around said wire, said bath consistnig essentially of ethylene glycol and zinc chloride.

11. The method of bonding a connector wire to a semiconductor device containing an indium electrode alloyed to a surface of a germanium wafer, comprising the step of inserting said wire into said electrode, dipping the assembly of said wire and said device into a flux selected from the group consisting of zinc chloride, zinc chloride plus ammonium chloride, and dilute hydrochloric acid, heating said assembly by immersion for about 5 to 10 seconds in a bath maintained at about 185° C. so that said electrode melts and flows around said wire, removing said assembly from said bath, and permitting said electrode to solidify around said wire, said bath consisting of an alcohol having a boiling point above 190° C.

12. The method as in claim 11, wherein said bath consists of glycerin.

13. The method of bonding connector wires to a transistor containing indium electrodes alloyed to opposite surfaces of an N-type germanium wafer, comprising the step of pressing a connector wire into each said electrode, dipping the assembly of said transistor and said wires into a flux bath consisting of 8% hydrochloric acid in polyethylene glycol, heating said assembly by immersion for about 5 to 10 seconds in a bath maintained at about 185° C. so that said electrode melts and flows around said wire, removing said assembly from said bath, and permitting said electrode to solidify around said wire, said bath consisting of a polyethylene glycol having a boiling point above 190° C.

References Cited in the file of this patent

UNITED STATES PATENTS

| | | |
|---|---|---|
| 2,262,901 | Murphy | Nov. 18, 1941 |
| 2,327,715 | Ingerson | Aug. 24, 1943 |
| 2,525,336 | Bierwirth | Oct. 10, 1950 |
| 2,763,822 | Frola et al. | Sept. 18, 1956 |
| 2,820,135 | Yamakawa | Jan. 14, 1958 |
| 2,825,667 | Mueller | Mar. 4, 1958 |
| 2,842,841 | Schnable et al. | July 15, 1958 |
| 2,877,396 | Armstrong et al. | Mar. 10, 1959 |
| 2,882,464 | Blais | Apr. 14, 1959 |
| 2,894,862 | Mueller | July 14, 1959 |
| 2,939,204 | Knott et al. | June 7, 1960 |